US006573653B1

United States Patent
Ishinaga

(10) Patent No.: US 6,573,653 B1
(45) Date of Patent: Jun. 3, 2003

(54) CHIP SEMICONDUCTOR LIGHT-EMITTING DEVICE

(75) Inventor: Hiroki Ishinaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 10 days.

(21) Appl. No.: 09/807,335

(22) PCT Filed: Aug. 9, 2000

(86) PCT No.: PCT/JP00/05348

§ 371 (c)(1),
(2), (4) Date: Apr. 10, 2001

(87) PCT Pub. No.: WO01/13437

PCT Pub. Date: Feb. 22, 2001

(30) Foreign Application Priority Data

Aug. 12, 1999 (JP) ............................. 11-228638

(51) Int. Cl.⁷ ................................. H01J 63/04
(52) U.S. Cl. ..................... 313/512; 313/113; 313/114; 313/498
(58) Field of Search ................. 313/512, 113, 313/500, 114; 362/341, 346, 551, 555, 231, 235, 247, 252, 343, 347, 349, 350; 257/98, 99, 100

(56) References Cited

U.S. PATENT DOCUMENTS 3,875,456 A * 4/1975 Kano et al. ................. 313/501
4,000,437 A * 12/1976 Lederhandler et al. ...... 313/500

OTHER PUBLICATIONS

Japanese Utility Model Application No. 106560/1990 (Senken Electric Co.), Laid–open No. 63661/1992, May 29, 1992.*

* cited by examiner

Primary Examiner—Nimeshkumar D. Patel
Assistant Examiner—Jason Phinney
(74) Attorney, Agent, or Firm—Gerald T. Bodner

(57) ABSTRACT

A chip light-emitting device includes a baseboard LED elements different in color of emission light are respectively mounted on two electrodes formed on a surface of the baseboard. A reflector has an aperture in an oval form as viewed in plan and placed on the baseboard such that the LED elements are at a center surrounded by a slant surface of an inner wall of the aperture. The slant surface includes two reflection surfaces continued almost at a center of the reflector with respect to a thickness direction. The reflection surfaces are set with respective inclination angles such that a first angle ($\theta p$), given between reflection light reflected on a lower side of the lower reflection surface and reflection light reflected on an upper side the lower reflection surface that are due to the first output light of the first LED element arranged closer to the lower reflection surface, equal to a second angle ($\theta q$), given between reflection light reflected on a lower side the upper reflection surface and reflection light reflected on an upper side of the upper reflection surface that are due to second output light from the second LED element arranged distant from the lower reflection surface.

8 Claims, 5 Drawing Sheets

CHIP SEMICONDUCTOR LIGHT-EMITTING DEVICE

FIELD OF THE INVENTION

This invention relates to chip semiconductor light-emitting devices and, more particularly, to a chip semiconductor light-emitting device for emitting color mixture of light by the use of light-emitting diode (LED) elements different in emission-light color.

PRIOR ART

Conventionally, there has been known a chip light-emitting device having a light source arranged with LED elements different in emission-light color to emit color mixture of light. FIG. 7 and FIG. 8 depict an example of such a device, wherein FIG. 7 shows a perspective view of a chip light-emitting device 10 while FIG. 8 is a side view of FIG. 7 as viewed in a section on line A—A. In FIG. 7, the chip light-emitting device 10 has a baseboard 2 on which electrodes 3a, 3b and electrodes 4a, 4b are formed of conductive material.

In one end of the baseboard 2, semi-circular cutouts 8a, 8a are provided to form, thereon, conductive films, such as electroplated layers, respectively connected to the electrodes 3b and 4b. Also, in the other end of the baseboard 2, semi-circular cutouts are similarly provided. The conductive films, such as electroplated layers, formed on the semi-circular cutouts extend down to a backside of the baseboard.

An LED element 1a is mounted by die bonding on the electrode 3a, and an LED element 1b is mounted by die bonding on the electrode 4a. The LED element 1a emits, e.g. red light. The LED element 1b emits light of different color from the light color by the LED element 1a, e.g. green light. The LED element 1a is electrically connected to the electrode 3b through wire bonding using a metal wire 5a. The LED element 1a is electrically connected to the electrode 4b through wire bonding using a metal wire 5b.

The baseboard 2 mounting thereon the LED elements 1a, 1b is rested with a reflector 6 formed of opaque resin. Light-transmissive resin 7 such as epoxy resin is filled in an aperture defined in the reflector 6 as shown in FIG. 8, thereby forming a chip light-emitting device 10. The reflector 6 is oval as viewed in plan and has a slant surface 6a having upward inclination with respect to a contact surface with the baseboard 2. The reflector 6 is formed by injection-molding, e.g. of white-colored liquid-crystal polymer.

The chip light-emitting device 10 is surface-mounted on a printed circuit board. Electrical connection is made between the conductive films formed on the backside of the baseboard 2 through the semi-circular cutouts and the circuit pattern on the printed circuit board. By operating the LED element 1a for red-light emission and the LED element 1b for green-light emission, the chip light-emitting device 10 emits light mixed with red and green.

The operation of the chip light-emitting device 10 will be explained with reference to FIG. 8. It is now assumed that the LED element 1a has a light source Sa. The output light of the light source Sa reflects upon a slant surface 6a of the reflector 6 at a lower side than a belly thereof and turns into reflection light Ra directed toward a luminous center P of the chip light-emitting device 10. Also, the output light from the light source Sb of the LED element 1b reflects upon a slant surface 6a of the reflector 6 as a surface closer to the baseboard and turns into reflection light Rx directed toward the luminous center P of the chip light-emitting device 10.

In this manner, the chip light-emitting device 10 has the reflector 6 formed with a vertically-penetrating slant surface 6a to reflect and radiate the output light of the LED element by the reflector. The reflection light is collected to a luminous center P, thereby improving luminous efficiency.

Also, the output light from the light source Sa of the LED element 1a and the output light from the light source Sb of the LED element 1b, in the vicinity of a top end of the slant surface 6a of the reflector 6, respectively turn into reflection light Rb and Ry to be emitted from the chip light-emitting device 10.

FIG. 9 is an explanatory view showing, in a vertical sectional view of FIG. 8, a luminous-intensity distribution given by the LED elements 1a, 1b. In FIG. 9, Ia is a luminous-intensity distribution of reflection light given by the LED element 1a while 1b is a luminous-intensity distribution of reflection light given by the LED element 1b. On a right side of the luminous center P, the LED element 1a arranged distant from the slant surface 6a provides reflection light upon nearly an upper half of the slant surface 6a.

Meanwhile, on a left side of the luminous center P, the LED element 1b arranged distant from the slant surface 6a provides reflection light nearly upon an upper half of the slant surface 6a. In this manner, the luminous-intensity distributions by the LED elements 1a, 1b are different in characteristic on between the left and right sides of the luminous center P.

As shown in FIG. 9, in the conventional chip light-emitting device, the reflector slant surface is set with a constant inclination angle θx. Consequently, the luminous-intensity distribution is different on left and right sides with respect to the luminous center P between the LED element arranged closer to the slant surface and the LED element arranged closer to the slant surface. Due to this, there is emphasis on any of light colors emitted by the LED elements 1a and 1b depending upon a position viewing the light emission surface of the chip light-emitting device. Thus, there has been a problem that there is difference in color-mixture tone and hence difference in color of emission light from the chip light-emitting device.

As for the LED element arranged distant as viewed from the slant surface, the output light reflects almost on an upper half only of the slant surface. Thus, there has been a problem that there is decrease in amount of light directed toward a luminous center and hence decrease in a center luminous intensity of the chip light-emitting device 10.

SUMMARY OF THE INVENTION

Therefore, it is a primary object of this invention to provide a novel chip semiconductor light-emitting device.

Another object of the invention to provide a chip light-emitting device capable of making even the degree of mixing colors.

A chip semiconductor light-emitting device according to the present invention comprises: a baseboard; first and second conductors formed on the baseboard; first and second semiconductor light-emitting elements respectively mounted on the first and second conductors and different in color of emission light; and a reflector placed on the baseboard such that a slant surface thereof surrounds the first and second semiconductor light-emitting elements; the slant surface including first and second reflection surfaces continuing in a thickness direction of the reflector and respectively having first and second inclination angles, the first reflection surface being closer to the baseboard and the second reflection surface more distant from the baseboard;

the first and second angles being set such that first output light of the first semiconductor light-emitting element arranged closer to the first reflection surface provides a first angle, given between reflection light reflected on a lower side of the first reflection surface and reflection light reflected on an upper side of the first reflection surface, equal to a second angle, given between reflection light reflected on a lower side of the second reflection surface and reflection light reflected on an upper side of the second reflection surface that are provided by second output light of the second semiconductor light-emitting device arranged distant from the first reflection surface.

In an embodiment, the first angle is represented by θp and the second angle by θq. The first inclination angle θa and θb are set to have a relationship θp=θq. This makes equal the directivity of reflection light due to the first output light of the first semiconductor light-emitting element to the directivity of reflection light due to the second output light of the second semiconductor light-emitting element, and hence, on the light-emitting surface, a luminous-intensity distribution due to the first semiconductor light-emitting element to a luminous-intensity distribution due to the second semiconductor light-emitting element. Accordingly, the first output light and the second output light are mixed of color homogeneously.

Furthermore, if the first reflection surface and the second reflection surface are continued almost in a center of the reflector with respect to the thickness direction, the first and second reflection surfaces reflect efficiently the first output light and the second output light. This maximizes the amount of each of reflection light travelling toward a luminous center. Due to this, center luminous intensity can be increased for the chip semiconductor light-emitting device.

Meanwhile, by extending the opposite ends of the reflector to the cutouts formed in the baseboard opposite ends, the reflector can be size-increased. This can further increase the center luminous intensity of the chip light-emitting device.

Incidentally, the reflector aperture in plan shape can be selected to the purpose from among arbitrary forms including a circular form in addition to the oval and rectangular forms as were described in the embodiments.

The above described objects and other objects, features, aspects and advantages of the present invention will become more apparent from the following detailed description of the present invention when taken in conjunction with the accompanying drawings.

BEST FORM FOR CARRYING OUT THE INVENTION

Figure 1:
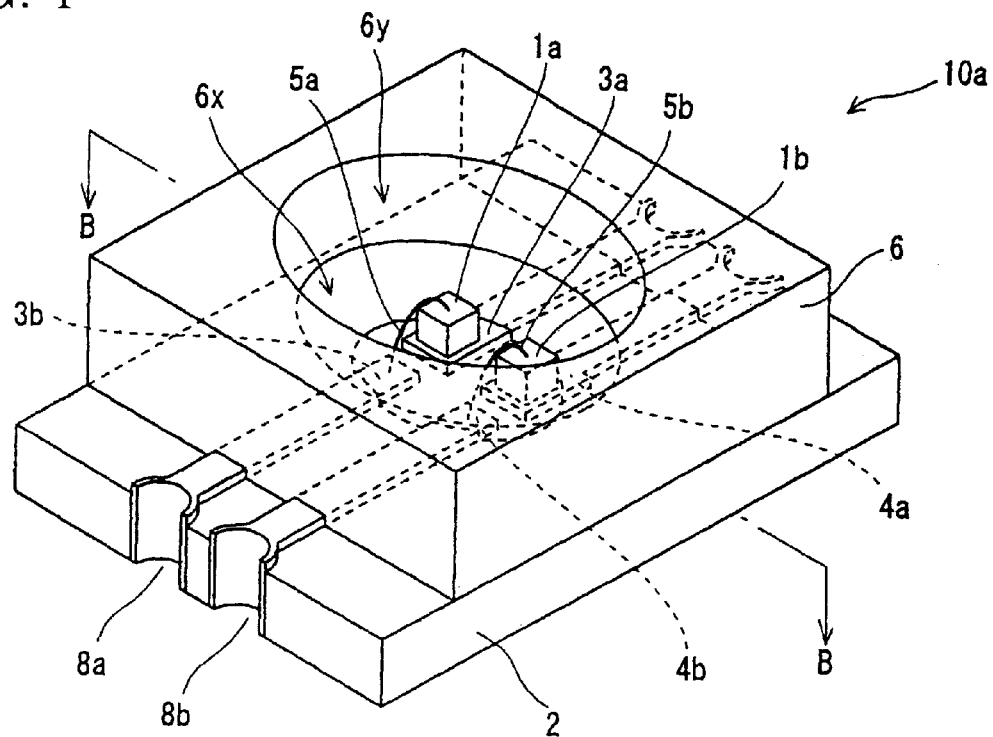
FIG. 1 is a schematic perspective view showing a chip light-emitting device according to an embodiment of this invention.
Figure 2:
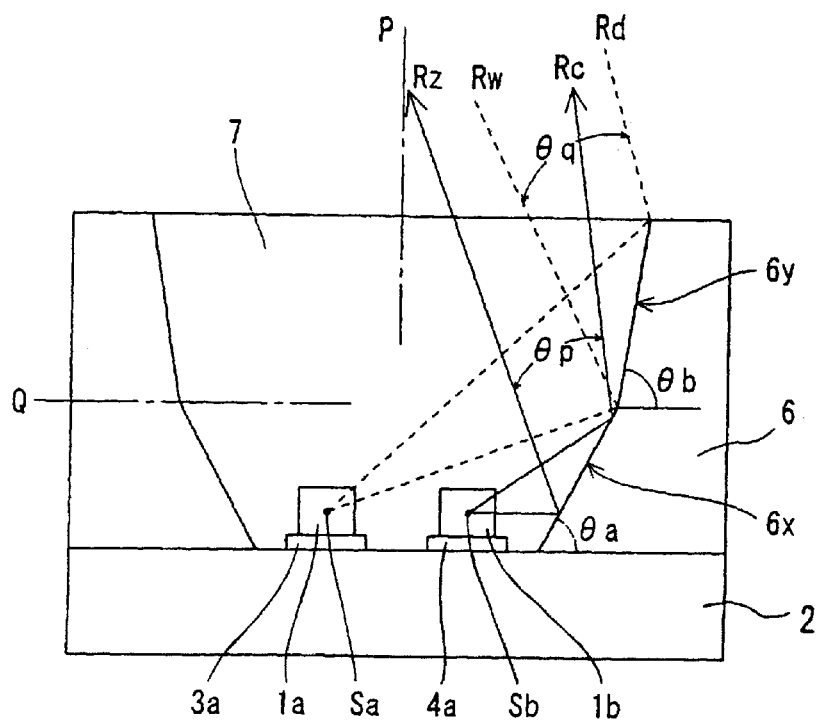
FIG. 2 is a vertical sectional view taken on line B—B in FIG. 1.
Figure 7:
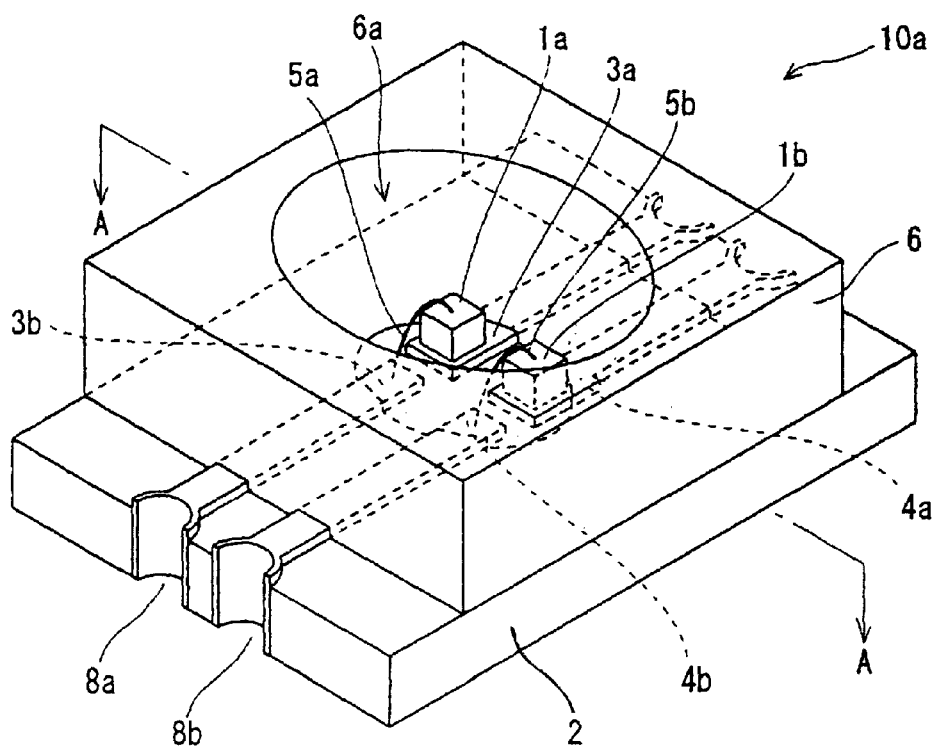
FIG. 7 is a perspective view showing a conventional chip light-emitting device.
Figure 8:
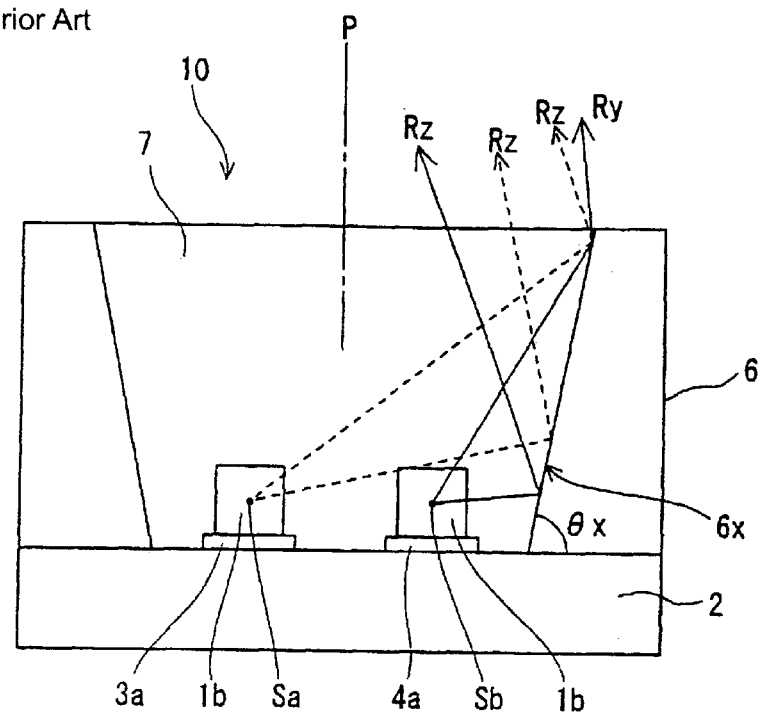
FIG. 8 is a vertical sectional side view taken on line A—A in FIG. 7.
Figure 9:
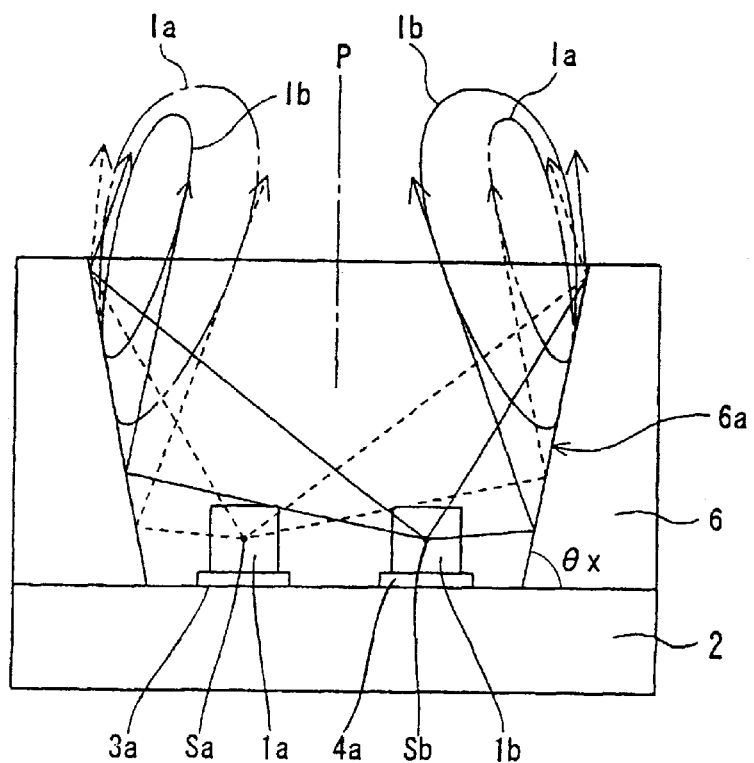
FIG. 9 is an explanatory view showing a distribution of luminous intensity of FIG. 8.

Now, an embodiment of the present invention will be explained with reference to the drawings. FIG. 1 is a schematic perspective view showing a chip light-emitting device according to an embodiment of the invention while FIG. 2 is a vertical sectional side view as viewed in section B—B of FIG. 1. The identical for corresponding parts to those of the prior-art chip light-emitting device shown in FIGS. 7 and 8 are denoted with the same reference numerals, and detailed explanations thereof will be omitted.

In FIG. 1, a reflector 6 formed of opaque resin has, at a central portion, a vertically-penetrating aperture in an oval form as viewed from the above. The aperture has slant surfaces 6x, 6y formed on an inner wall thereof. The reflector 6 is formed of whitish material such as liquid crystal polymer to increase reflectivity and hence improve center luminous intensity in the top light-emitting device.

Meanwhile, there is a case of applying electroplating with metal on the whitish material, such as liquid crystal polymer, of the slant surfaces 6x, 6y of the reflector 6, in order to improve the center luminous intensity of the chip light-emitting device. Such metal electroplating may use copper-nickel (Cu—Ni), copper-nickel-gold (Cu—Ni—Au), copper-nickel-silver (Cu—Ni—Ag) or the like.

The slant surfaces 6x, 6y of the aperture inner wall of the reflector 6 are formed with different slant angles with respect to the baseboard such that the aperture area increases in a stepwise fashion in a thickness, upward direction of the reflector 6. This slant angle is set θa <θb as shown in FIG. 2, provided that the slant angle of the slant surface 6x with respect to the substrate 2 is given θa and the slant angle of the slant surface 6y continuing to the slant surface 6x is θb with respect to the baseboard 2.

The reflector 6 is rested upon the baseboard 2 to accommodate the LED element 1a and LED element 1b mounted on the baseboard 2 at a center in a space surrounded by the slant surfaces 6x, 6y, as shown in the vertical sectional side view of FIG. 2. Next, opaque resin 7 is poured through the aperture of the reflector 6. The opaque resin 7 flows also into a contact surface between the baseboard 2 and the reflector 6. This bonds the reflector 6 onto the baseboard 2 and encapsulates the LED element 1a and LED element 1b.

Herein, the slant surfaces 6x, 6y formed in the inner surface of the reflector 6 are divided at a point Q located almost in a center of the reflector 6 with respect to the thickness direction, as shown in FIG. 2. In the example of FIG. 2, in one side surface of the reflector 6 (on the light side with respect to the luminous center P), the slant surface 6x is selected in slant angle θa such that the output light of the LED element 1b is reflected at positions from the lower to upper portions thereof to collect reflection light toward a luminous center P. Also, the slant surface 6y is selected in slant angle θb selected such that the output light of the LED element 1a is reflected at positions from the lower to upper portions to collect reflection light toward the luminous center P.

It is assumed herein that the output light of the LED element 1b reflected upon a lower portion of the slant surface 6x is Rz, the light of same reflected upon the upper portion is Rc, the output light of the LED element 1a reflected upon the lower portion of the slant surface 6y is Rw, and the light of same reflected upon the upper portion is Rd. Furthermore, it is also assumed that the angle between a position providing the reflection light Rz and a position providing the reflection light Rc is given θp when the output light of the LED element 1a is reflected upon the slant surface 6x, and the angle between a position providing the reflection light Rw and a position providing the reflection light Rd is given θq when the output light of the LED element 1b is reflected upon the slant surface 6y.

In this case, the slant angle θa of the slant surface 6x relative to the baseboard 2 and the slant angle θb of the slant surface 6y to the baseboard 2 are set to provide a relationship θp=θq between the angles.

Figure 3:
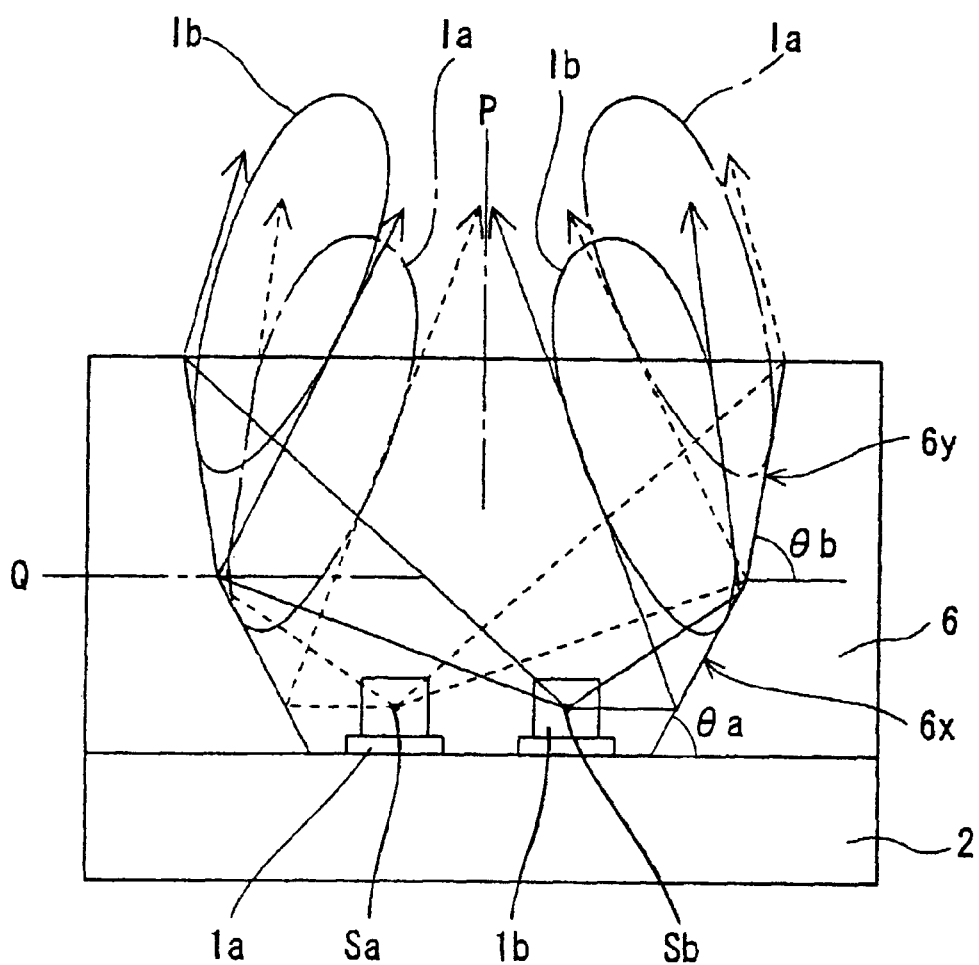
FIG. 3 is an explanatory view showing a distribution of luminous intensity of FIG. 2.

FIG. 3 is an explanatory view showing luminous-intensity distribution by the LED elements. In FIG. 3, as viewing the right side of the luminous center P, the slant surface 6x closer to the baseboard, at positions of from the lower to upper portions, reflects the output light of the LED element 1b arranged closer to the slant surface 6x. also, the outer slant surface 6y, at positions from the lower to upper portions, reflects the output light of the LED element 1a arranged distant from the slant surface 6x.

Next, as viewing the left side of the luminous center P in the figure, the slant surface 6x closer to the baseboard, at positions from the lower to upper portions, reflects the output light of LED element 1a arranged closer to the slant surface 6x. Also, the outer slant surface 6y at positions from the lower to upper portion reflects the output light of the LED element 1b arranged distant from the slant surface 6x.

On the right side of the luminous center P, the luminous-intensity distribution Ia due to the LED element 1a is almost in equal characteristic to that of the luminous-intensity distribution Ib due to the LED element 1b. Also, on the left side of the luminous center P, the luminous-intensity distribution Ia due to the LED element 1a is almost in equal characteristic to that of the luminous intensity distribution Ib due to the LED element 1b.

This is due to the equal directivity in reflection light between the LED element 1a and the LED element 1b, by setting as θp=θq the relationship between an angle θp given by reflected ones of the output light of the LED element 1a and an angle θq given by reflected ones of the output light from the LED 1b. This provides the same color of emission light when viewing the light-emitting surface of the chip light-emitting device from every position, thus improving the degree of color mixture.

Also, because the two slant surfaces with different inclination angles of the reflector 6 are continued in the vicinity of a center of the reflector with respect to the thickness direction, each slant surface serves to evenly reflect the output light of the LED elements with efficiency. This increases the amount of reflection light directed toward the luminous center, thus increasing center luminous intensity of the chip light-emitting device.

In the FIG. 1 example, the semi-circular cutouts 8a, 8a are exposed from the reflector 6. This provides a merit to cope with any of the cases of using solder reflow and solder dipping when the chip light-emitting device 10a is placed on a printed circuit board and the conductive films extending to the backside of the baseboard 2 through the semicircular cutouts 8a, 8a are electrically connected to a circuit pattern of the printed circuit board.

Figure 4:
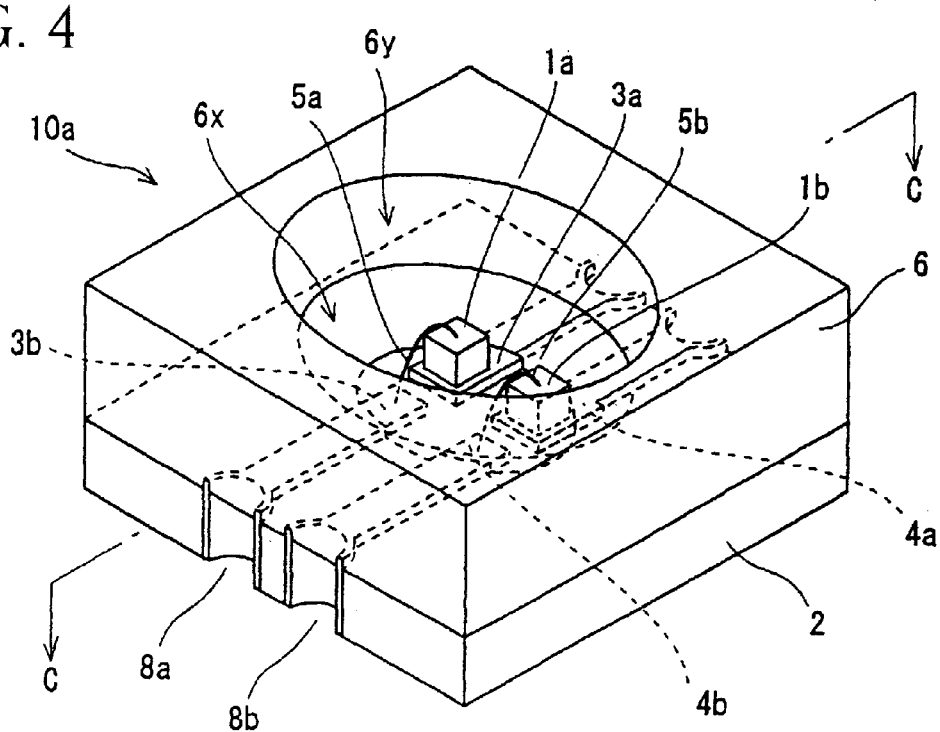
FIG. 4 is a schematic perspective view showing a chip light-emitting device according to another embodiment of the invention.

FIG. 4 is a schematic perspective view showing chip light-emitting device 10b according to another embodiment of the invention. Comparing with the example of FIG. 1, the example of FIG. 4 is structured that the reflector 6 has an increased length so that its opposite ends are extended to the semi-circular cutouts in the baseboard opposite ends. With this structure, the reflector 6 has an increased size, provided that the baseboard 2 is fixed in size. This provides improved reflection efficiency and hence improved center luminous intensity of the chip light-emitting device.

Figure 5:
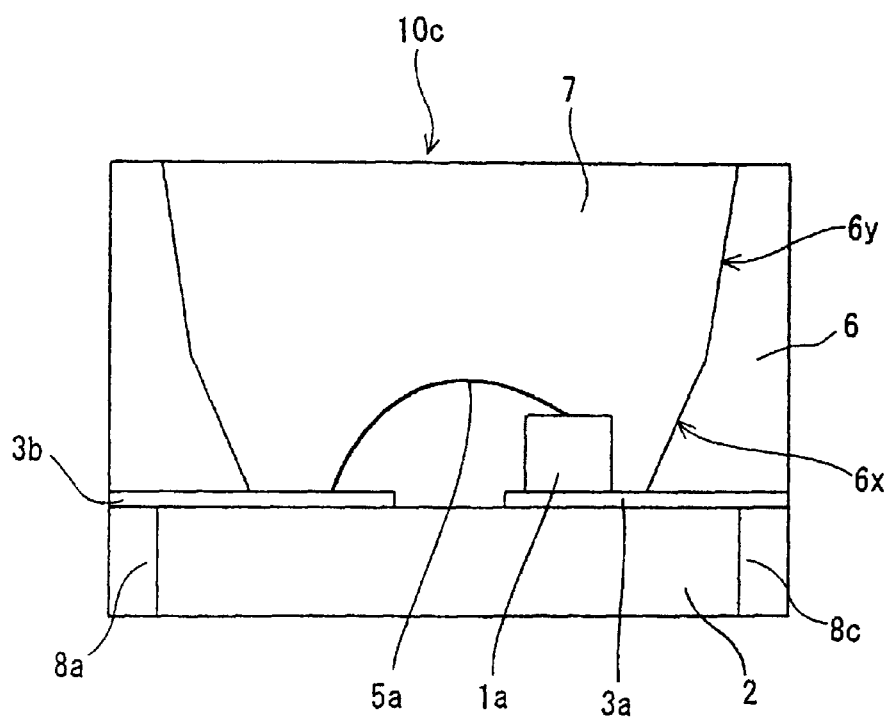
FIG. 5 is a schematic vertical sectional side view showing a chip light-emitting device according to another embodiment of the invention.

FIG. 5 is a schematic vertical sectional side view showing a chip light-emitting device 10c according to another embodiment of the invention, corresponding to a sectional view on line C—C in FIG. 4. In the example of FIG. 5, the electrodes 3b, 3c are extended to the top ends of the semi-circular cutouts 8a, 8c.

When pouring light-transmissive resin 7 into the aperture of the reflector 6, the light-transmissive resin 7 may possibly flow out of an end of the reflector 6 and adhere on the semi-circular cutout 8a, 8c. This results in poor electrical connection through solder between the conductive films of the semi-circular cutouts 8a, 8c and the circuit pattern of the printed circuit board. However, with the structure of FIG. 5, even where light-transmissive resin 7 flows out through an end of the reflector 6, light-transmissive resin 7 is prevented from adhering on the semi-circular cutouts 8a, 8c.

In the above examples, the LED element is energized by providing semi-circular cutouts in opposite end surfaces of the baseboard and connecting between the electrodes and the circuit pattern of a printed circuit board. The present invention is applicable also to a chip light-emitting device of a type formed with elongate-hole cutouts in the opposite ends of the baseboard to connect between the electrodes to a circuit pattern of a printed circuit board and energize the LED element.

Figure 6:
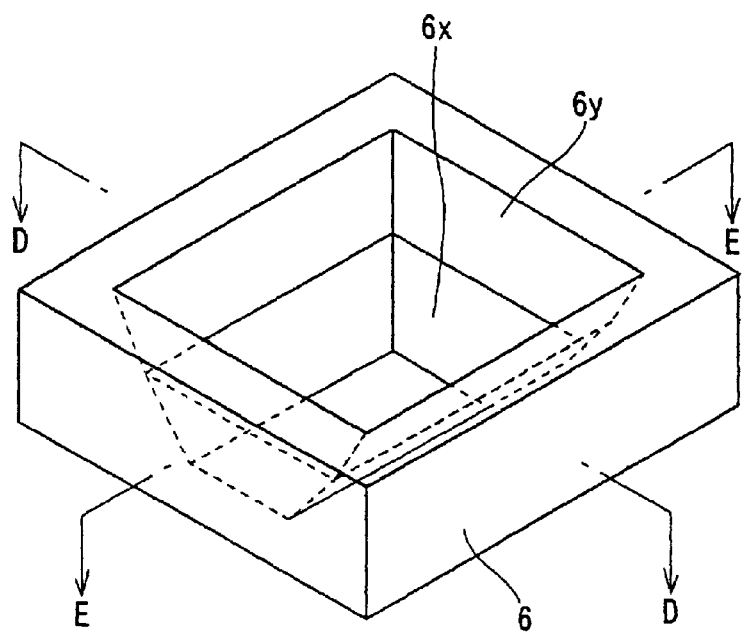
FIG. 6 is a perspective view showing a reflector for the chip light-emitting device according to the other embodiment of the invention.

FIG. 6 is a perspective view showing another embodiment of reflector for a chip light-emitting device of the invention. In the example of FIG. 6, a reflector 6 forms an aperture nearly in a rectangular form as viewed in plan. In also this case, the vertical sectional side view as viewed in the D—D section and E—E section forms slant surfaces 6x, 6y with inclination angles of θa and θb with respect to the baseboard 2, as was shown in FIG. 1. This provides the similar effect to the case having the aperture in an oval form as viewed in plan. This also provides a chip light-emitting device having a light-emitting surface in a rectangular form, thus providing variation in the shape of the light-emitting surface. Incidentally, circular or other arbitrary forms may be selected besides the shape of oval, rectangular and others.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip semiconductor light-emitting device, comprising:

a baseboard;

first and second conductors formed on said baseboard;

first and second semiconductor light-emitting elements respectively mounted on said first and second conductors and different in color of emission light; and a reflector placed on said baseboard such that a slant surface thereof surrounds said first and second semiconductor light-emitting elements;

said slant surface including first and second reflection surfaces continuing in a thickness direction of said reflector and respectively having first and second inclination angles, said first reflection surface being closer to said baseboard and said second reflection surface more distant from said baseboard;

the first and second angles being set such that first output light of said first semiconductor light-emitting element arranged closer to said first reflection surface provides a first angle, given between reflection light reflected on a lower side of said first reflection surface and reflection light reflected on an upper side of said first reflection surface, equal to a second angle, given between reflection light reflected on a lower side of said second reflection surface and reflection light reflected on an upper side of said second reflection surface that are provided by second output light of said second semiconductor light-emitting device arranged distant from said first reflection surface.

2. A chip semiconductor light-emitting device according to claim 1, wherein said first inclination angle is smaller than the second inclination angle.

3. A chip semiconductor light-emitting device according to claim 1, further comprising two cutouts formed respectively in opposite ends of said baseboard, said two conductors being formed by two electrodes extending from a backside to a main surface of said baseboard respectively through said two cutouts, and said reflector being set in a size having opposite ends covering said cutouts.

4. A chip semiconductor light-emitting device according to claim 1, wherein said reflector defines an aperture, and wherein said aperture of said reflector has a shape in plan of one selected from an oval form, a rectangular form and a circular form.

5. A chip semiconductor light-emitting device according to claim 2, further comprising two cutouts formed respectively in opposite ends of said baseboard, said two conductors being formed by two electrodes extending from a backside to a main surface of said baseboard respectively through said two cutouts, and said reflector being set in a size having opposite ends covering said cutouts.

6. A chip semiconductor light-emitting device according to claim 5, wherein said reflector defines an aperture, and wherein said aperture of said reflector has a shape in plan of one selected from an oval form, a rectangular form and a circular form.

7. A chip semiconductor light-emitting device according to claim 2, wherein said reflector defines an aperture, and wherein said aperture of said reflector has a shape in plan of one selected from an oval form, a rectangular form and a circular form.

8. A chip semiconductor light-emitting device according to claim 3, wherein said reflector defines an aperture, and wherein said aperture of said reflector has a shape in plan of one selected from an oval form, a rectangular form and a circular form.

* * * * *